United States Patent
Carinci et al.

(10) Patent No.: US 11,016,155 B2
(45) Date of Patent: May 25, 2021

(54) METHOD, APPARATUS AND STORAGE MEDIUM FOR RECORDING A MAGNETIC RESONANCE DATASET

(71) Applicant: Siemens Healthcare GmbH, Erlangen (DE)

(72) Inventors: Flavio Carinci, Wuerenlingen (CH); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/395,877

(22) Filed: Apr. 26, 2019

(65) Prior Publication Data
US 2019/0331749 A1    Oct. 31, 2019

(30) Foreign Application Priority Data
Apr. 26, 2018    (EP) ..................... 18169552

(51) Int. Cl.
*G01R 33/48*    (2006.01)
*G01R 33/483*    (2006.01)
*G01R 33/561*    (2006.01)

(52) U.S. Cl.
CPC ..... *G01R 33/4818* (2013.01); *G01R 33/4835* (2013.01); *G01R 33/5611* (2013.01); *G01R 33/5617* (2013.01); *G01R 33/5613* (2013.01)

(58) Field of Classification Search
USPC ....................................................... 324/309
See application file for complete search history.

(56) References Cited

U.S. PATENT DOCUMENTS

| | | | | |
|---|---|---|---|---|
| 5,742,163 | A * | 4/1998 | Liu ................... | G01R 33/56554 324/307 |
| 9,354,290 | B2 * | 5/2016 | Greiser .............. | G01R 33/5676 |
| 2013/0279786 | A1 * | 10/2013 | Lin ........................ | G06T 11/005 382/131 |
| 2015/0022207 | A1 * | 1/2015 | Meyer ................ | G01R 33/4818 324/309 |
| 2016/0170000 | A1 | 6/2016 | Liu et al. | |

(Continued)

FOREIGN PATENT DOCUMENTS

| CN | 104181484 A | 12/2014 |
|---|---|---|
| CN | 105738846 A | 7/2016 |

(Continued)

OTHER PUBLICATIONS

Erpeng Dai et al: "Simultaneous multislice accelerated interleaved EPI DWI using generalized blipped-CAIPI acquisition and 3D K-space reconstruction: SMS Accelerated iEPI DWI"; Magnetic Resonance in Medicine; Bd. 77; Nr. 4; pp. 1593-1605; XP055493908; US; ISSN: 0740-3194; DOI: 10.1002/mrm.26249.

(Continued)

*Primary Examiner* — Rodney E Fuller
(74) *Attorney, Agent, or Firm* — Schiff Hardin LLP

(57) ABSTRACT

In a method and apparatus for recording a magnetic resonance dataset with a number of reception coils, wherein the measurement signals of the magnetic resonance dataset contain measurement signals from at least two slices, the measurement signals are recorded segmented by the measurement signals being recorded in a first area of k-space with a first scanning density and in a second area of k-space with a second scanning density.

18 Claims, 6 Drawing Sheets

(56) References Cited

U.S. PATENT DOCUMENTS

| | | |
|---|---|---|
| 2016/0313431 A1 | 10/2016 | Beck et al. |
| 2017/0219672 A1 | 8/2017 | Miyazaki et al. |
| 2018/0348323 A1 | 12/2018 | Carinci et al. |
| 2019/0049541 A1 | 2/2019 | Carinci et al. |

FOREIGN PATENT DOCUMENTS

| | | |
|---|---|---|
| CN | 106030329 A | 10/2016 |
| JP | 2017131664 A | 8/2017 |

OTHER PUBLICATIONS

Kangrong Zhu et al.: "Autocalibrating CAIPIRINHA: Reformulating CAIPIRINHA as a 3D Problem", Proceedings of the International Society for Magnetic Resonance in Medicine, ISMRM, 20th Annual Meeting and Exhibition, Melbourne, Australia, May 5-11, 2012, Apr. 21, 2012 (Apr. 21, 2012), XP040622948,; 2012.

Yutzy, Stephen R. et al., "Improvements in Multislice Parallel Imaging Using Radial CAIPIRINHA", in: Magnetic Resonance in Medicine, vol. 65, pp. 1630-1637, DOI 10.1002/mrm.22752; 2011.

Zeller, Mario et al. "Boosting BOLD fMRI by K-Space Density Weighted Echo Planar Imaging" PLOS One, vol. 8, No. 9, e74501; Sep. 2013 https://doi.org/10.1371/journal.pone.0074501.

Mengye Lyu et al.: "Multi-band PROPELLER Imaging with Autocalibration", Proceedings of the International Society for Magnetic Resonance in Medicine, ISMRM, 23rd Annual Meeting and Exhibition, Toronto, Ontario, Canada, May 30-Jun. 5, 2015, Nr. 2411, May 15, 2015 (May 15, 2015), XP040668088; 2015.

Setsompop, Kawin et al. "Blipped-Controlled Aliasing in Parallel Imaging for Simultaneous Multislice Echo Planar Imaging with Reduced g-Factor Penalty" Magnetic Resonance in Medicine, vol. 67, pp. 1210-1224, 2012 (first published online 2011).

Breuer, Felix A. et al. "Controlled Aliasing in Parallel Imaging Results in Higher Acceleration (CAIPIRINHA) for Multi-Slice Imaging" Magnetic Resonance in Medicine; vol. 53; pp. 684-691; 2005; and.

European Search Report dated Nov. 21, 2018, for Application No. 18169552.9.

Chinese Action dated Jan. 28, 2021, Application No. 201910337999.1, and English translation.

\* cited by examiner

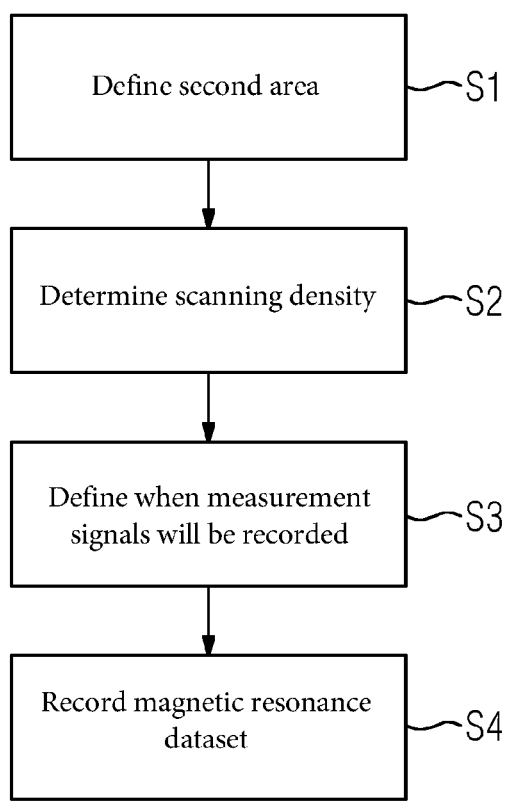

METHOD, APPARATUS AND STORAGE MEDIUM FOR RECORDING A MAGNETIC RESONANCE DATASET

BACKGROUND OF THE INVENTION

Field of the Invention

The present invention concerns a method for recording a magnetic resonance dataset with a number of radio-frequency (RF) reception coils, wherein the measurement signals of the magnetic resonance dataset originate from at least two slices, and wherein the measurement signals are recorded segmented.

Description of the Prior Art

In magnetic resonance (MR) tomography, radio-frequency (RF) pulses are used to produce magnetic resonance signals as measurement signals. In MR spectroscopy, FID (free induction decay) are usually detected, and echo signals are detected in MR imaging.

In such cases the acquired data are entered into a memory that is organized so as to represent a mathematical domain known as k-space. The entry of the acquired data into the k-space memory is called scanning k-space. The scanning can be Cartesian, radial or spiral scanning. Cartesian scanning is described below, without loss of generality. In such scanning, k-space rows are filled, which run in the image domain in the read direction $G_R$. This direction in k-space is referred to by $k_x$.

A measurement sequence has three phases: the excitation phase, the signal evolution phase and the signal detection phase.

In the excitation phase, the data acquisition scanner is operated with a preparation module, with in order to weight the magnetization of the nuclear spins in a desired manner. In the detection phase, one or more k-space rows is read out.

If a single k-space row is read out in the detection phase, then this corresponds to a usual recording strategy, as used, for example, with a spin echo sequence, a gradient sequence, echo or the faster version in the form of a FLASH sequence.

If more than one k-space row is recorded in the data acquisition, but not all rows are recorded, this is referred to as a segmented measurement. This can occur since physical or medical reasons allow only the recording of a part of the measurement data. Physical reasons are a short $T_2$ or $T_2^*$. Accordingly a Fast Spin Echo with the acronym FSE or an EPI, short for Echo Planar Imaging, can be used as measurement sequences with a number of k-space segments.

Medical reasons are, for example, a short heart pulse, so the measurement time is restricted by the heartbeat.

If all necessary k-space rows can be recorded in one scan, this is also referred to a single-shot sequence. This is likewise possible with EPI and FSE with sufficiently long relaxation times.

The quantity of measurement data to be recorded is given in such cases by the Nyquist theorem:

$$\Delta k < 2\pi/L.$$

In this equation, $\Delta k$ is the spacing of the signals in k-space and L is the extent of the object in the dimension to be displayed.

Measurement sequences such as FLASH, FSE and True-FISP with a shortened measurement time were initially developed in order to achieve a reduction of the measurement time. These continue to fulfill the Nyquist theorem during the recording of measurement data.

In order to achieve a further acceleration, it was necessary to remove the restrictions of the Nyquist theorem. This is possible since the Nyquist theorem merely requires a restriction of the bandwidth of the signal to be scanned. No other prior knowledge is required or used, however.

In parallel imaging, only a part of the total amount k-space data that are needed to fulfill the Nyquist theorem is recorded, but a number of reception coils are used for this purpose. K-space is thus scanned at low frequencies that are too low. This leads to aliasing, also called aliasing artifacts.

In order to avoid these artifacts, a specific reconstruction method is used during the image reconstruction. The SENSE method deconvolves the measurement data in the image domain. In the GRAPPA method, the missing k-space rows are reconstructed with the use of calibration data. The calibration data form a complete measurement dataset with respect to the Nyquist theorem. The calibration data can be a part of, or the entirety of k-space.

A further development of the scanning scheme for parallel imaging with a number of slices is the CAIPIRINHA sequence, an acronym for Controlled Aliasing In Parallel Imaging Results IN Higher Acceleration. In this method, the aliasing artifacts are explicitly modified in order to improve the image reconstruction.

In MS-CAIPIRINHA (Breuer F. A., Blaimer M., Heidemann R. M., Müller M. F., Griswold M. A. and Jakob P. M.: Controlled Aliasing In Parallel Imaging Results IN Higher Acceleration for Multi-Slice Imaging, Magn. Res. Med. 53: 684-691) a modification with two slices is achieved by the two slices being excited with alternating dual-band pulses.

A version called blipped CAIPIRINHA (Setsompop K., Gagoski B. A., Polimeni J. R., Witzel T., Van Wedeen J., and Wald L. L.: Blipped-Controlled Aliasing in Parallel Imaging (blipped-CAIPI) for simultaneous multi-slice EPI with reduced g-factor penalty, Magn. Res. Med. 67: 1210-1224) represents a further development in which, during or before the readout of the measurement signals, the slice gradient is switched in an oscillating manner by gradient blips.

With this kind of scanning as well, calibration data are needed for evaluation.

SUMMARY OF THE INVENTION

An object of the present invention is to provide a method for recording a magnetic resonance dataset, in which k-space is scanned with a blipped CAIPIRINHA method and the recording of measurement data is implemented more efficiently.

This object is achieved by a method for recording a magnetic resonance dataset of the type initially desired but, wherein, in accordance with the invention, the measurement signals are recorded in a first area of the k-space with a first scanning density, and recorded in a second area of k-space with a second scanning density.

The basis of the invention is the use of a segmented measurement sequence so that more data are recorded than are needed to create an image dataset, and in this way an additional measurement, namely the calibration measurement, is not needed.

Segmented recording can also be referred to as recording with a number of segments, as well as recording multiple sub-scans. A segment here refers to a part of the total data acquisition, which is represented as an echo train. The arrangement of the segment in k-space can be a contiguous area. As an alternative, for example with a ten-segment recording, the first segment can be all tenth k-space positions starting with position one, the second segment all tenth k-space positions starting with position two, etc. This can be referred to as offset scanning.

The spacing Δκ, i.e. the spacing of the signals in k-space, can define the scanning density.

In the recording of echo signals, the scanning density can be varied in the $k_y$-direction and $k_z$-direction, and in the recording of FIDs, in the $k_x$-direction as well.

The consecutive k-space points, which have been scanned with the same scanning density, are considered here as areas of k-space in this case. In such cases, at least one change of the scanning density must take place, but a very high number of such changes can take place.

The theoretical number of areas is limited by the number of k-space signals to be recorded, and by the segmentation.

A simultaneous multislice (SMS) recording with CAIPIR-INHA blipping can be considered as a 3D recording, as has been described in Setsompop et al. A change in $k_z$-direction is carried out by a gradient blip, i.e. a gradient in the slice selection direction. In this case $k_z$ does not have to change for each following measurement signal, but there must be at least one change per segment. The higher the number of changes, the better the SNR.

The spacing of the k-space signals in the $k_x$-direction is preferably always the same. In the $k_y$-direction, the scanning density depends on the acceleration factor and on the field of view (FOV). In the $k_z$-direction, the scanning density depends on the SMS factor and on the FOV shift factor. The SMS factor is the number of simultaneously excited slices. The FOV shift factor refers to the offset of the simultaneously excited slices from one another, and indeed is standardized to the FOV. The change that is achieved is defined by the blip gradients.

By contrast, in the present invention the scanning density is varied in the $k_y$-direction and/or $k_z$-direction.

Preferably, the scanning density is changed in the $k_y$-direction. This is done by setting the phase encoding gradient accordingly.

As an alternative or in addition, the scanning density can be changed in the $k_z$-direction. With a blipped CAIPIRINHA method, blip gradients are present in the z-direction, in order to switch between the k-space rows in the $k_z$-direction. By an additional switching or omission of the blip gradient, the scanning density in the z direction can also be set in combination with the phase encoding gradient in the $k_y$-direction.

As an alternative or in addition, the scanning density can be changed in the $k_x$-direction. This option is provided during the recording of FIDs.

The magnetic resonance dataset is recorded with a number of reception coils. In other words, parallel imaging or a parallel recording is used. Preferably the GRAPPA method is used for reconstruction of an image dataset from the magnetic resonance raw dataset. Aliasing artifacts are thus avoided by a reconstruction of missing data in k-space.

The acquired magnetic resonance dataset can also be referred to as a raw dataset. This dataset is to be converted into an image dataset by a number of reconstruction steps, such as a Fourier transformation, or by using the GRAPPA method for avoiding aliasing artifacts, as already mentioned.

Preferably, the measurement signals in a third area can be recorded with a third or the first scanning density. Basically, as described, there can be a greater number of areas with the same scanning density. It is preferred, however, for an odd number of areas to be present. Preferably, there can be at least three, in particular exactly three, areas present.

Preferably, the areas are arranged axially symmetrically to the middle of k-space in relation to the $k_y$-direction. A symmetrical arrangement means that the first ten and the last ten k-space rows, for example, are recorded with a first scanning density, and the k-space rows between them are recorded with a second scanning density. The changes in the $k_z$-direction that occur are not taken into account. Preferably, the areas can be arranged symmetrically to the middle of k-space in relation to the $k_z$-direction.

Preferably the second area encompasses the middle of k-space. In particular the second area can encompass the middle of k-space in the $k_y$-direction and/or the $k_z$-direction.

In the description of the scanning given below, the procedure in the $k_y$-direction is described unless explicitly stated otherwise. In the $k_z$-direction, a change of the $k_z$ value usually takes place, and in the $k_x$-direction an echo signal is scanned.

K-space can be scanned with different strategies for segmented measurements. The scanning can begin either starting from the edge of the k-space, starting from the center of the k-space or, as from the second segment or echo train, at the point where k-space scanning of the first or more generally last segment or echo train ends. It is thereby defined that no change of scanning density takes place exactly in the middle of k-space.

Preferably, the second scanning density is higher than the first scanning density. In one or more segments or echo trains, the higher scanning density enables a complete scanning to be achieved in this area. Complete scanning satisfies the Nyquist theorem. The second scanning density can be twice as high, or four times as high as the first and/or third scanning density.

Preferably, in each segment, the measurement signals or the additional measurement signals of the second area are recorded before the measurement signals of the first area and/or before the measurement signals of the third area. At the start of the measurement the signal is at its highest, so the calibration signals have the highest SNR.

As an alternative, the measurement signals of the second area can be recorded after the measurement signals of the first area and before the measurement signals of the third area in each segment. Then the additional measurement signals in the second area are interposed.

As a further alternative, the measurement signals or the additional measurement signals of the second area can be recorded after the measurement signals of the first area and after the measurement signals of the third area in each segment. This means that the actual measurement remains unchanged and the residual signal at the end of the measurement will still be used for calibration purposes.

Preferably, the measurement signals of the second area, after the passage of at least two segments, produce a complete set of calibration data. Calibration data are then available at least every two segments. This is advantageous with moving examination areas.

Preferably, a Fast Spin Echo (FSE) is used as the measurement sequence. In this case the segment is produced automatically by the echo trains. As an alternative, an EPI can be used as the measurement sequence. As a further alternative, a FLASH can be used as the measurement sequence. As a further alternative, a TrueFISP can be used as the measurement sequence.

Preferably, the measurement signals are echo signals. In other words, an imaging sequence is used or a read gradient is present during the reading of the measurement signals.

Preferably, k-space in the second area is completely scanned at the latest after recording all segments. The object, as described, is to use the k-space rows in the second area for calibration. Then, they only need to be recorded completely in the sense of making a calibration possible.

Preferably, k-space in the second area is scanned completely at least twice. Furthermore, k-space in the second area is scanned completely after the measurement of every second segment. In particular, k-space in the second area is scanned after the measurement of each segment. The more often a complete scanning of k-space occurs in the second area, the better the calibration can be undertaken during movement of the patient. If the second area is completely scanned after the measurement of two segments, the method does not cease to record k-space rows in the second area.

Preparation modules can be used during the excitation phase. The excitation phase concludes with the last RF pulse for excitation. In a spin echo sequence, the excitation phase consists only of the 90° pulse, in a FLASH, it consists of the RF pulse.

Preferably, the excitation phase features the application of an excitation pulse, in particular a single excitation pulse. This can excite a 2D-slice or a number of slices.

The excitation pulse is preferably a multiband pulse, in particular a dual band pulse. Then the excitation pulse can simultaneously excite two or more slices. Preferably, a slice selection gradient can be applied at the same time during the application of the excitation pulse. This is possible independently of the pulse shape.

The excitation pulse is preferably phase-modulated.

The slices that are acquired at the same time advantageously lie in parallel, i.e. they do not cross.

In the evolution phase there can be at least one slice rephasing gradient and/or at least one phase encoding gradient and/or at least one read dephasing gradient and/or at least one refocusing pulse, etc.

In the detection phase at least one read gradient is usually applied in imaging sequencing, moreover the acquisition window is open.

In a sequence, an excitation phase can also be followed by a number of evolution and detection phases, as is the case with FSE for example. Otherwise the phases are repeated until such time as all measurement signals are recorded.

Since the invention can be used in different measurement sequences, the following definitions will apply.

As is usual, a sequence of RF pulses, gradient fields, waiting times and acquisition windows, which precisely define and characterize the measurement sequence is referred to as a measurement sequence. Examples of measurement sequences are FLASH, spin echo, gradient echo, FSE, EPI, TrueFisp, etc., as already mentioned. These image datasets produced thereby can be weighted by preparation modules.

A measurement sequence in such cases is emptied of defined or definable sub-sequences or sub-scans, i.e, the segments. In a Fast Spin Echo, a number of refocusing pulses are used after an excitation pulse, which is why this is referred to as an echo train.

This information is intended to illustrate the existing conventions of those skilled in the art.

Since a number of reception coils are used in the recording of data, only a part of a complete set of k-space data is recorded by each coil. The missing data can be computed with the GRAPPA method described above.

Preferably, the evolution phase has at least one, in particular exactly one, refocusing pulse. Through the multiple occurrence of evolution and detection phase, an FSE is created.

For radiating the excitation pulse and/or the refocusing pulses, a body coil or a coil array can be used. The echo signals are read out by a coil array.

Preferably, a slice selection gradient is activated at the same time as the excitation pulse and/or refocusing pulse or the refocusing pulses in each case. This makes a slice-selective excitation possible.

Preferably, after the reading out of an echo signal, a phase rewind gradient can be applied in a detection phase. This is intended to bring the magnetization back into the middle of the k-space.

The above object is also achieved in accordance with the invention by a magnetic resonance apparatus that includes a magnetic resonance scanner and a controller that operates the scanner in order to implement any or all embodiments of the method according to the invention, as described above.

The above object also is achieved in accordance with the present invention by a non-transitory, computer-readable data storage medium encoded with programming instructions that, when the storage medium is loaded into a controller of an magnetic resonance apparatus, cause the controller to operate the magnetic resonance apparatus, or the scanner thereof, in order to implement any or all embodiments of the method according to the invention, as described above.

The method can be implemented in the controller in this case as software but also as (hard-wired) hardware.

BRIEF DESCRIPTION OF THE DRAWINGS

FIG. 6 is a flowchart for recording a magnetic resonance dataset.

DESCRIPTION OF THE PREFERRED EMBODIMENTS

Figure 1:
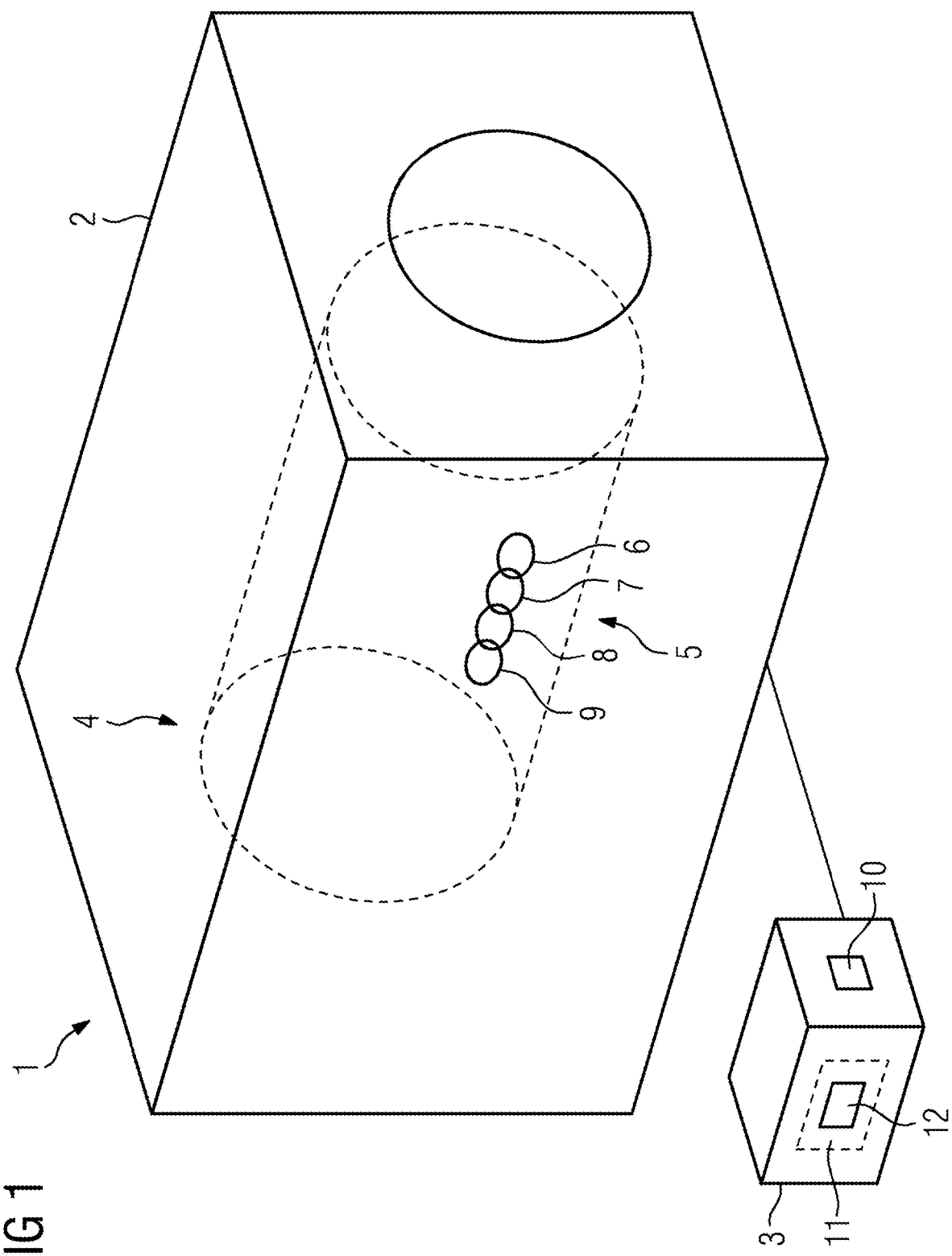
FIG. 1 shows a magnetic resonance system.

FIG. 1 shows a magnetic resonance system 1. This essentially includes a magnetic resonance scanner 2 and a controller 3.

Arranged in the magnetic resonance scanner 2 is a transmit coil arrangement 4. The transmit coil arrangement 4 can be embodied as a body coil. As an alternative, the transmit coil arrangement can be embodied as a coil array.

A coil array with coils 6, 7, 8 and 9 is present as a reception coil arrangement 5. The coil array can of course also feature a different number of coils. Measurement signals can be recorded by parallel imaging with the coil array 5.

In a further embodiment, the transmit coil arrangement 4 and the reception coil arrangement 5 can be formed by the same coils.

However, in the embodiment shown, the coil array 5 is used only to read out the measurement signal.

The controller 3 has a processor 10, a non-transitory data storage medium 11 located therein, computer program code 12 stored thereon. Measurement sequences can be embodied in the computer program code 12.

For clarity, further components of the magnetic resonance system 1, such as gradient coils and a patient bed, are not shown.

Figure 2:
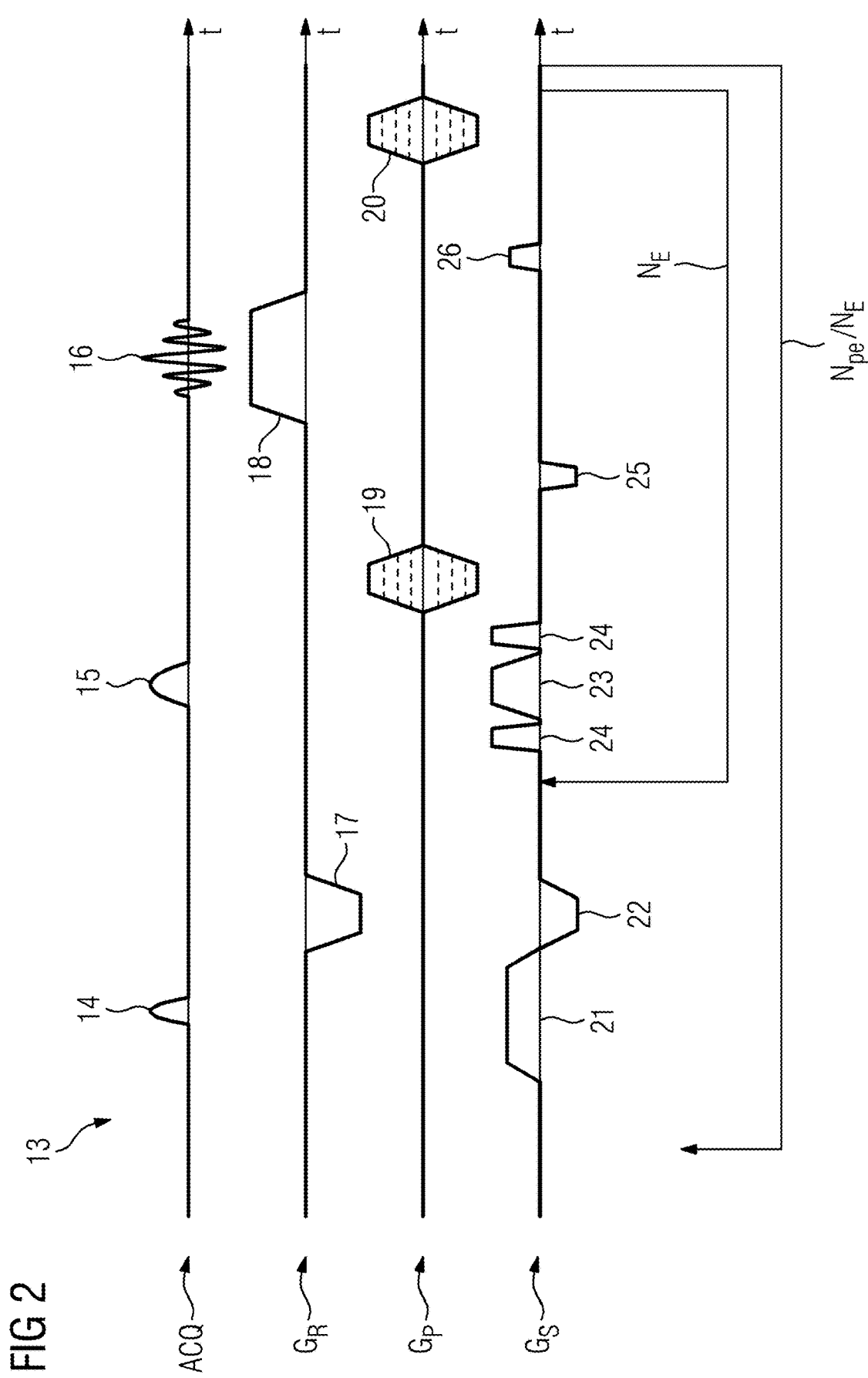
FIG. 2 shows a segmented measurement sequence.

FIG. 2 shows a sequence diagram 13 of an FSE measurement sequence for recording a magnetic resonance dataset.

With the FSE measurement sequence two slices are measured at the same time, a blipped CAIPIRINHA method is used for the scanning of the k-space.

The radio-frequency pulses and the acquisition window are plotted along the axis ACQ.

The excitation pulse 14 is embodied as a dual band pulse. It has a flip angle of 90°. The refocusing pulse 15 on the other hand possesses a flip angle of 180°. The excitation pulse 14 and the refocusing pulse 15 create the echo signal 16.

An echo train composed of $N_E$ echo signals 16 is created by applying the refocusing pulse 15 $N_E$ times.

In the read direction $G_R$ the read dephasing gradient 17 and the read gradient 18 are activated.

In the phase direction $G_P$ a phase encoding gradient 19 and a phase rewind gradient 20 are activated. The phase rewind gradient 20 compensates for the gradient moment of the phase encoding gradient 19, so that the overall phase in the phase direction between two refocusing pulses 15 is equal to zero.

Since $N_E$ echo signals per echo train are recorded, only $N_{pe}/N_E$ part experiments or segments or echo trains are executed. $N_{pe}$ in this case is the number of phase encoding steps.

In the slice direction $G_S$ a slice selection gradient 21 is present at the same time as the excitation pulse 14. This is followed by a slice rephasing gradient 22.

A slice selection gradient 23 is activated in parallel with the refocusing pulse 15. This is surrounded by crusher gradients 24. The crusher gradients 24 are intended to avoid the detection of unwanted echo signals from the refocusing pulse 15.

The gradient blips 25 and 26 are applied after each second refocusing pulse and move the readout location in the k-space in $k_z$-direction. The gradient blip 25 thus makes possible a change in k-space in the $k_z$-direction and the gradient blip 26 insures that there is a return to the original k-space position. With more than two slices the gradient blips 25 and 26 are to be adapted accordingly from the gradient moment forwards.

Depending on FOV shift and R factor as well as the k-space trajectory (i.e., the path in k-space along which acquired data are entered, this does not absolutely have to be the case with each second radio-frequency pulse. The gradient blips can thus also be applied after each third or fourth or fifth . . . refocusing pulse.

The gradient blip 25 can also be applied earlier and for example be amalgamated with one of the crusher gradients 24.

Figure 3:
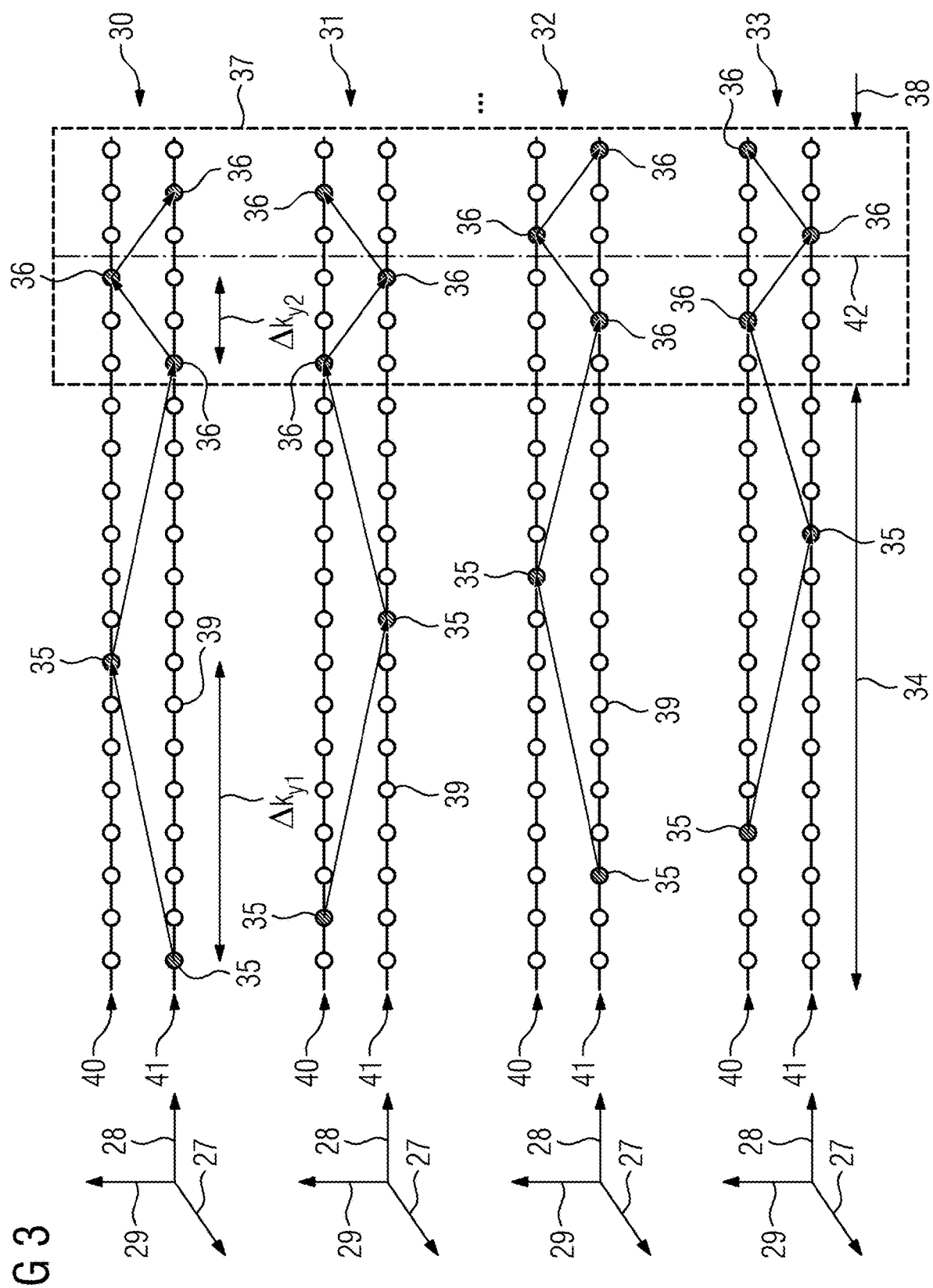
FIG. 3 shows a first k-space scanning scheme.

FIG. 3 shows a scanning scheme for a segmented measurement sequence. In FIG. 3 the axes 27 show the $k_x$-direction in each case, the axes 28 the $k_y$-direction and the axes 29 the $k_z$-direction. The k-space rows lie in the $k_x$-direction and are therefore shown as a point. The acquired k-space rows are shown filled with black and the omitted k-space rows filled with white.

The segments 30, 31, 32 and 33 are shown only as an example. Any number of segments can naturally be acquired with the FSE measurement sequence.

In the first area 34 the scanning density $\Delta\kappa_{y1}$ of the acquired measurement signals 35 is obviously lower than the scanning density $\Delta\kappa_{y2}$ of the acquired measurement signals 36 in the second area 37. The second area 37 is adjoined by a third area 38.

Measurement signals are shown in the first area 34 and in the second area 37 merely by way of example, which in particular are intended to illustrate the scanning density. In particular the number of the "skipped" k-space rows 39 and the number of the acquired measurement signals 35 and 36 are not to be seen as absolute.

However the change in the k-space in the $k_z$-direction between the rows 40 and 41 between the recording of two measurement signals 35 and/or 36 is relevant. This is achieved by the gradient blips 25 and 26. The progress in the $k_y$-direction on the other hand is brought about by the phase encoding gradient 19.

If all segments 30 to 33 and if necessary subsequent segments are executed then in the first area 34, which lies at the edge of the k-space and extends in the direction of the middle of the k-space, overall a zigzag pattern is scanned. That means that in each of the lines 40 and 41 each second $k_y$-space row is scanned. The scanned k-space rows in the form of the measurement signals 35 are offset by $\Delta k_y$ in relation to one another. In the first area a blipped CAIPIRINHA scanning is obtained in this way.

In the second area, after four segments 30, 31, 32 and 33, a completely scanned second area 37 is obtained. This can be used for calibration in a GRAPPA reconstruction.

The second area 37 lies symmetrically (more precisely, axis-symmetrically) with respect to the middle 42 of k-space in the $k_y$-direction. In the $k_z$-direction there is no axis symmetry. The middle 42 is deemed to be enclosed by the second area 37, if at least the adjoining k-space rows are scanned with a higher scanning density $\Delta\kappa_{y2}$.

In the third area 38 the same scanning density $\Delta k_{y1}$ as in the first area 34 is used. The third area 38 is however merely indicated for reasons of space.

In the scanning shown in FIG. 3 the measurement signals 36 recorded in the second area 37 are acquired in the middle of the measurement of a segment in each case. First, the outer k-space rows are recorded in the first area 34, then the scanning proceeds to the middle 42 of the k-space, acquires k-space rows 36 in the second area 37 there, and then moves outwardly again, in order to record the k-space rows of the third area 37.

However the scanning density $\Delta k_{y2}$ in the second area 37 can also be chosen higher or lower than shown. It can be chosen so that, after two segments 30 and 31 or 32 and 33 respectively, a completely scanned second area 37 is already present. As an alternative it can be chosen so that the complete scanning of the second area 37 is achieved after recording of all segments 30 to 33.

In summary it is noted once again that after all segments 30, 31, 32 and 33 have been executed, the first area 34 and the third area 38 are scanned at too low frequencies, but the second area 37 is not.

For completeness, it is noted that first all measurement signals 35 and 36 of the first segment 30 are recorded, then all measurement signals 35 and 36 of the second segment 31, subsequently all measurement signals 35 and 36 of the third segment 32 and so forth until the last segment, here the segment 33.

Figure 4:
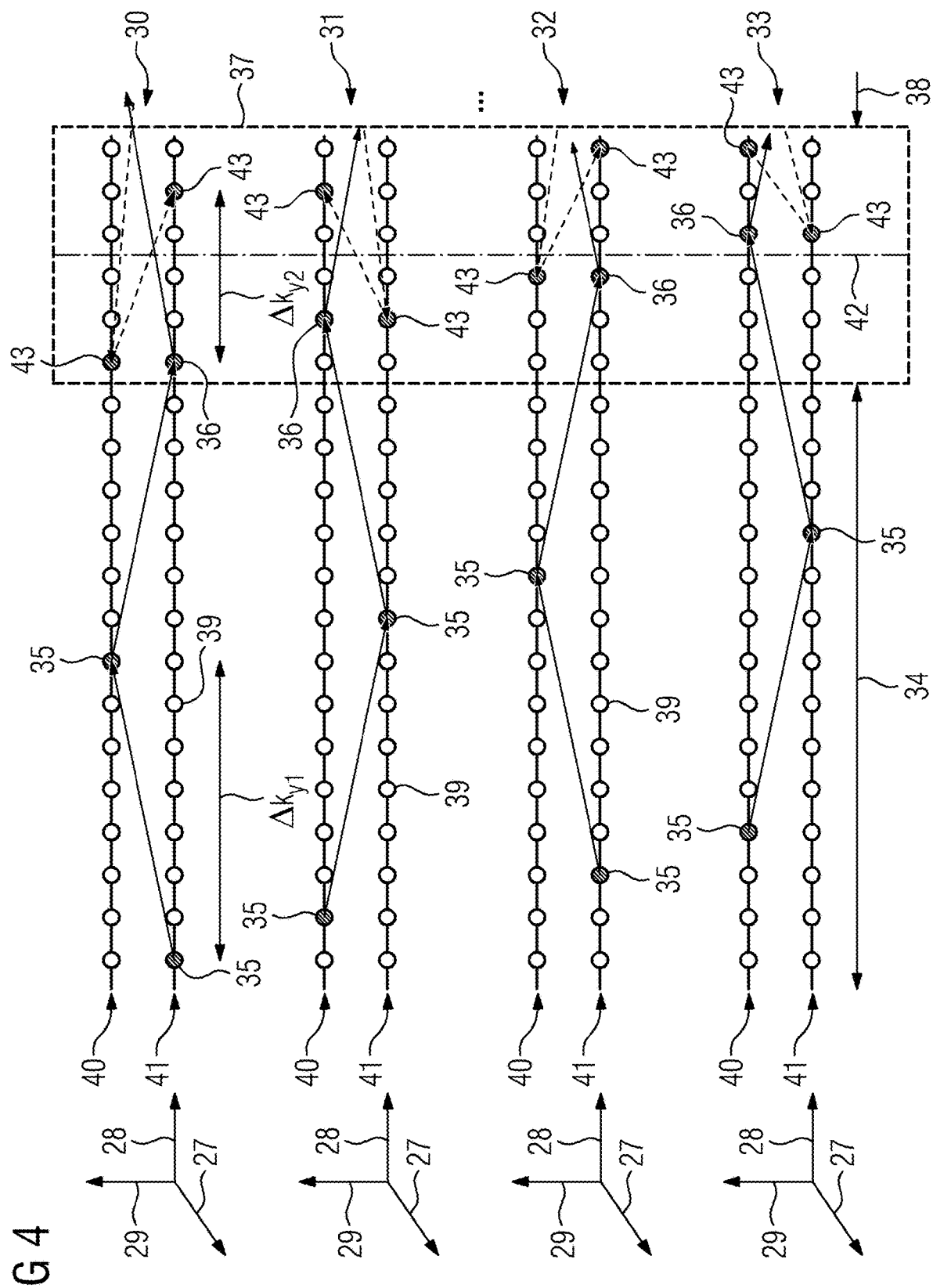
FIG. 4 shows a second k-space scanning scheme.

FIG. 4 shows an alternate method of operation for recording measurement signals 43 for calibration. In this method the measurement signals 35 of the first area 34, the measurement signals 36 of the second area 37 and the measurement signals of the third area 38 are scanned with a first scanning density $\Delta k_{y1}$. Thus the first segment 30 is initially scanned as with a known blipped CAIPIRINHA scanning. Subsequently thereto, in the second area 37, one or more additional measurement signals 43 are also recorded for calibration purposes. How many additional measurement signals 43 are recorded depends on the level of SNR that the measurement signal still has in respect of $T_2$ decay. It is naturally to be considered whether the calibration data should already be complete after the recording of one or two segments or only after the recording of all segments.

In a further alternate method of operation the additional measurement signals 43 can also be recorded at the beginning of the measurement of a segment.

Figure 5:
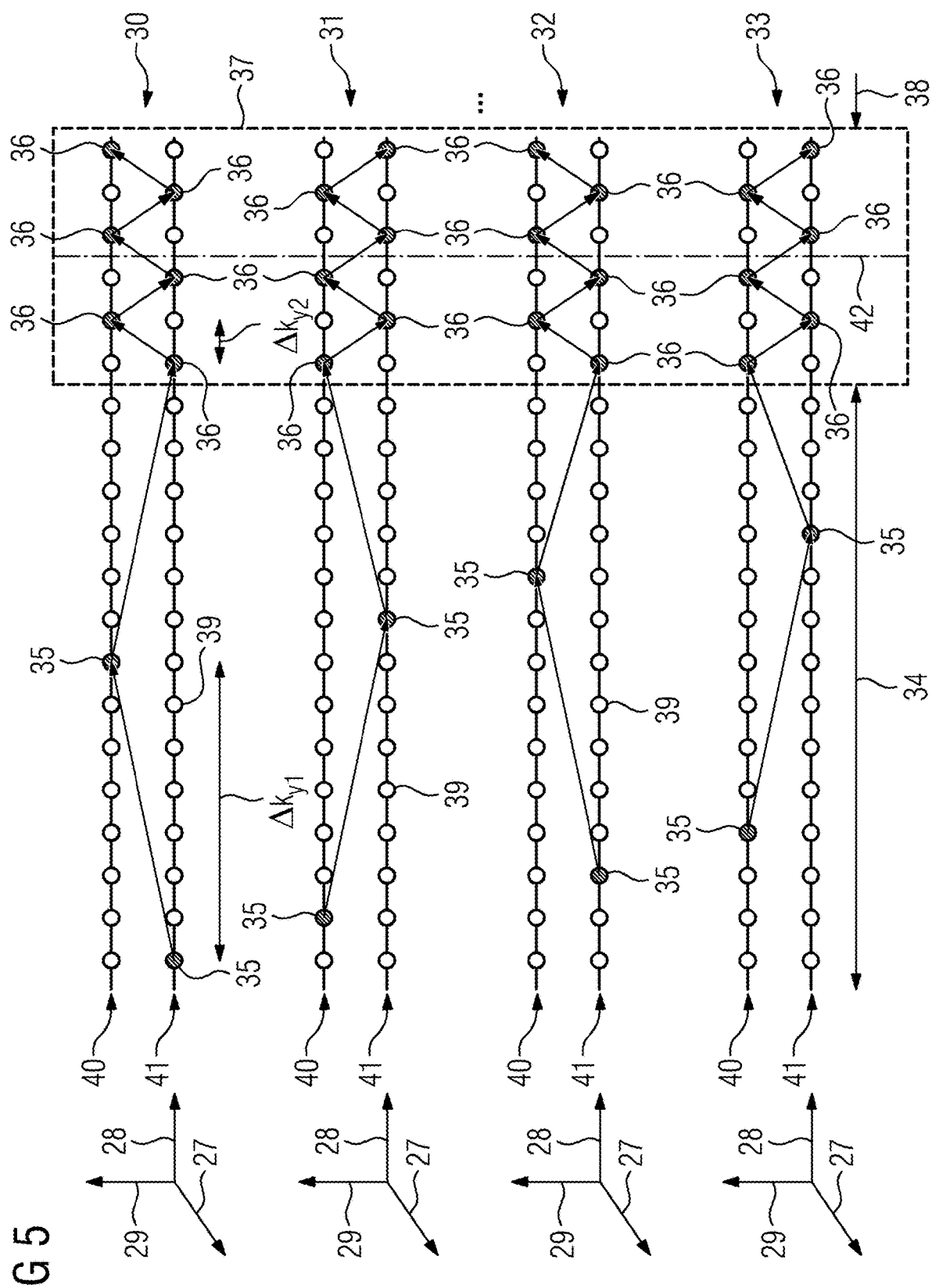
FIG. 5 shows a third k-space scanning scheme.

FIG. 5, in order to explain the change of the scanning density $\Delta k_{y2}$, shows a procedure in which, already after the measurement of two segments 30 and 31 or 32 and 33, complete calibration data are present. In this case the scanning density is twice as high as in FIG. 3, other than this the figures match.

In summary, starting from a blipped CAIPIRINHA scanning the procedure during segment measurement can thus be as follows, in order to obtain calibration data at the same time during the recording of an image dataset with two or more slices, as FIG. 6 shows.

First, in step S1, a second area 37 is defined, which is to be scanned completely, i.e. not scanned at too low frequencies. This includes the direction and the number of the k-space rows. In FIGS. 3 to 5 there are six k-space rows in the $k_y$-direction, and these are the middle k-space rows. Preferably there are at least 16 k-space rows, in particular in the $k_y$-direction.

The result produced automatically by this is that the outer fourteen k-space rows in the first area 34 and the outer fourteen k-space rows in the third area 38 are recorded scanned at too low frequencies, as provided for in blipped CAIPIRINHA. The number of the k-space rows in the first area 34 and the third area 38 is produced automatically from the overall number of the k-space rows and the number of the k-space rows in the second area 37.

In the second step S2 the scanning density $\Delta k_{y2}$ is sought. This is chosen so that a complete scanning of the second area is achieved after x segments, wherein x is a natural number between and including 1 and the number of the segments. Thus after each segment, always after two segments, always after four segments, and so on, or after the measurement of all segments a completely scanned second area 37 is obtained.

In the third step S3 it is defined when the measurement signals 36 and 43 of the second area 37 will be recorded. There are five options here. Either a part of the measurement signals 36 of the second area 37 is recorded as part of the usual measurement sequence of a segment 30, 31, 32, 33 and additional measurement signals 43 at another point in time. This point in time can lie before or after the measurement of the measurement signals 35 and 36 of the segment. Thus two options are produced.

As the third option, the additional measurement signals 43 are woven in during the measurement of the second area 37. Then the second area 37 can be acquired before or after or between the measurement of the first area 34 and third area 38.

In two cases the recording of the measurement signals 36 and 43 in the second area 37 is thus interrupted, in three cases it is directly one after the other.

In this case the process is always described in one segment 30, 31, 32 or 33. The recording of the segments 30, 31, 32 or 33 occurs one after the other.

In step S4 a magnetic resonance dataset is recorded, wherein the k-space or the measurement signals 35, 36 and 43 are scanned as defined.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for recording a magnetic resonance (MR) dataset, comprising:
   operating an MR data acquisition scanner comprising a plurality of radio-frequency (RF) reception coils to acquire MR signals originating from at least two simultaneously excited slices of a subject situated in the MR data acquisition scanner; and
   operating said MR data acquisition scanner to acquire said MR signals as a segmented measurement by (i) entering said MR signals into a first area of a memory organized as k-space with a first scanning density, and (ii) entering said MR signals into a second area of said memory organized as k-space with a second scanning density, to form said MR dataset.

2. A method as claimed in claim 1, further comprising:
   entering said MR signals into a third area of said memory organized as k-space with said first scanning density.

3. A method as claimed in claim 2, comprising:
   in each segment associated with the acquired segmented measurement of MR signals, acquiring said MR signals of said second area before acquiring at least one of the MR signals of said first area and acquiring the MR signals of said third area.

4. A method as claimed in claim 2, comprising:
   in each segment associated with the acquired segmented measurement of MR signals, acquiring the MR signals of said second area after acquiring the MR signals of said first area and before acquiring the MR signals of said third area.

5. A method as claimed in claim 2, comprising:
   in each segment associated with the acquired segmented measurement of MR signals, acquiring the MR signals of the second area after acquiring the MR signals of the first area and after acquiring the MR signals of said third area.

6. A method as claimed in claim 2, comprising:
   acquiring some of the MR signals of the second area between acquisition of the MR signals of the first area and the acquisition of MR signals of the third area; and
   acquiring a part of the MR signals of the second area before acquiring the MR signals of the first area and/or after acquiring the MR signals of the third area.

7. A method as claimed in claim 1, wherein said second area comprises a middle of k-space.

8. A method as claimed in claim 1, wherein said second scanning density is higher than said first scanning density.

9. A method as claimed in claim 1, comprising:
   acquiring said MR signals of said second area after executing at least two segments associated with the acquired segmented measurement of MR signals, and using said MR signals of said second area as a complete set of calibration data.

10. A method as claimed in claim 9, comprising:
    acquiring said MR signals of the second area after two segments associated with the acquired segmented measurement of MR signals.

11. A method as claimed in claim 1, comprising:
    dividing the acquisition of said MR data into at least three segments.

12. A method as claimed in claim 1, comprising:
    filling k-space in said second area after executing each segment associated with the acquired segmented measurement of MR signals.

13. A method as claimed in claim 1, comprising:
filling said second area of k-space at least twice.

14. A method as claimed in claim 1, wherein operating the MR data acquisition scanner comprises acquiring the MR signals originating from the at least two simultaneously excited slices of the subject in accordance with a simultaneous multislice (SMS) imaging technique.

15. A method as claimed in claim 1, wherein each of the first scanning density and the second scanning density is constant in a first k-space direction but varies in at least a second k-space direction.

16. A method as claimed in claim 15, wherein the first k-space direction is a $k_x$-direction, and
wherein each of the first scanning density and the second scanning density varies in a second k-space direction and a third k-space direction that includes a $k_y$-direction and a $k_z$-direction, respectively.

17. A magnetic resonance (MR) apparatus for recording a MR dataset, comprising:
an MR data acquisition scanner comprising a plurality of radio-frequency (RF) reception coils;
a controller configured to operate said MR data acquisition scanner, to acquire MR signals originating from at least two simultaneously excited slices of a subject situated in the MR data acquisition scanner; and
said controller being configured to operate said MR data acquisition scanner to acquire said MR signals as a segmented measurement by (i) entering said MR signals into a first area of a memory organized as k-space with a first scanning density, and (ii) entering said MR signals into a second area of said memory organized as k-space with a second scanning density, to form said MR dataset.

18. A non-transitory, computer-readable data storage medium encoded with programming instructions, said storage medium being loaded into a controller of a magnetic resonance (MR) apparatus comprising an MR data acquisition scanner comprising a plurality of radio-frequency (RF) reception coils, said programming instructions causing said controller to record a MR dataset by:
operating said MR data acquisition scanner to acquire MR signals originating from at least two simultaneously excited slices of a subject situated in the MR data acquisition scanner; and
operating said MR data acquisition scanner to acquire said MR signals as a segmented measurement by (i) entering said MR signals into a first area of a memory organized as k-space with a first scanning density, and (ii) entering said MR signals into a second area of said memory organized as k-space with a second scanning density, to form said MR dataset.

* * * * *